United States Patent
Oden et al.

(10) Patent No.: US 10,669,622 B2
(45) Date of Patent: Jun. 2, 2020

(54) COATED CUTTING TOOL AND A METHOD FOR COATING THE CUTTING TOOL

(71) Applicant: SECO TOOLS AB, Fagersta (SE)

(72) Inventors: Magnus Oden, Tullinge (SE); Mats Johansson Joesaar, Orebro (SE); Isabella Citlalli Schramm, Bexbach (DE)

(73) Assignee: SECO TOOLS AB, Fagersta (SE)

( * ) Notice: Subject to any disclaimer, the term of this patent is extended or adjusted under 35 U.S.C. 154(b) by 170 days.

(21) Appl. No.: 15/567,408

(22) PCT Filed: Apr. 19, 2016

(86) PCT No.: PCT/EP2016/058676
§ 371 (c)(1),
(2) Date: Oct. 18, 2017

(87) PCT Pub. No.: WO2016/169935
PCT Pub. Date: Oct. 27, 2016

(65) Prior Publication Data
US 2018/0119271 A1     May 3, 2018

(30) Foreign Application Priority Data

Apr. 20, 2015 (SE) .................. 1550468

(51) Int. Cl.
*B23B 27/14*   (2006.01)
*C23C 14/32*   (2006.01)
*C23C 14/06*   (2006.01)
*C23C 28/04*   (2006.01)

(52) U.S. Cl.
CPC .......... *C23C 14/325* (2013.01); *B23B 27/148* (2013.01); *C23C 14/0641* (2013.01); *C23C 28/044* (2013.01)

(58) Field of Classification Search
USPC .......... 51/307, 309; 428/336, 697, 698, 699; 204/192.15, 192.16
See application file for complete search history.

(56) References Cited

U.S. PATENT DOCUMENTS

| 5,330,853 A | 7/1994 | Hofmann et al. |
| 5,882,778 A | 3/1999 | Sugizaki et al. |
| 2004/0115484 A1 | 6/2004 | Horling et al. |

(Continued)

FOREIGN PATENT DOCUMENTS

| CN | 101524904 A | 9/2009 |
| CN | 101952482 A | 1/2011 |

(Continued)

OTHER PUBLICATIONS

Horling et al "Mechanical properties and machining performance of Ti(1-x)Al(x)N coated cutting tools" Suef & Coat Techn 191 p. 384-392. (Year: 2005).*

(Continued)

*Primary Examiner* — Archene A Turner
(74) *Attorney, Agent, or Firm* — Corinne R. Gorski

(57) ABSTRACT

A coated cutting tool includes a body and a hard and wear resistant coating on the body. The coating has at least one metal based nitride layer, wherein the layer is a nitrogen deficient (Ti1-xAlx)Ny layer with $0<x<0.7$ and $0.4<y<1$ and a layer thickness between 0.5 μm and 15 μm.

15 Claims, 8 Drawing Sheets

(56) References Cited

U.S. PATENT DOCUMENTS

2011/0111197 A1* 5/2011 Johansson ............... B23B 27/14
   204/192.38
2014/0013914 A1 1/2014 Senbokuya et al.

FOREIGN PATENT DOCUMENTS

| CN | 102449194 A | 5/2012 |
|----|----|----|
| CN | 102859026 A | 1/2013 |
| CN | 103338885 A | 10/2013 |
| EP | 2098611 B1 | 2/2013 |
| WO | 2013/002385 * | 1/2013 |

OTHER PUBLICATIONS

Chen et al "The influence of age-hardening on turning and milling performance of Ti—Al_N coated inserts" Surf & Coat Techn 202 p. 5158-5161. (Year: 2008).*

J.Bujak et al: "Influence of the nitrogen pressure on the structure and properties of (Ti,Al)N coatings deposited by cathodic vacuum arc PVD process", Surface and Coatings Technology, vol. 180-181, No. 181, Dec. 18, 2003, pp. 150-157.

* cited by examiner

COATED CUTTING TOOL AND A METHOD FOR COATING THE CUTTING TOOL

RELATED APPLICATION DATA

This application is a § 371 National Stage Application of PCT International Application No. PCT/EP2016/058676 filed Apr. 19, 2016 claiming priority to SE 1550468-1 filed Apr. 20, 2015.

TECHNICAL FIELD

The present invention relates to a coated cutting tool for chip forming metal machining comprising a body and a coating designed to be used in metal cutting applications generating high tool temperatures. The coating comprising at least one (Ti,Al)N layer deposited by means of physical vapour deposition, preferably cathodic are evaporation. The invention also relates to a method for coating the cutting tool and to the use of the cutting tool.

BACKGROUND OF THE INVENTION

Since the mid 1980's, efforts have been made to improve the properties, for example, wear resistance and hence the performance of tool coatings. At that time, the common practice was to coat cutting tools with TiN. However, due to its relatively poor oxidation resistance at elevated temperatures, alloying Al in (Ti,Al)N was suggested and implemented with good results in the mid-1980's. Today (Ti,Al)N based coatings are among the most common hard and protective coating materials used in metal cutting applications. The cubic, B1, structure of (Ti,Al)N, as a monolith layer and/or part of a laminated coating structure, combine attractive mechanical properties such as high hardness and improved temperature and oxidation resistance providing good performance in metal machining applications. The technological benefits of (Ti,Al)N and its excellent physical properties, especially at elevated temperatures, is partly explained in terms of a spinodal decomposition process during which cubic (Ti,Al)N decompose isostructurally into coherent cubic c-AlN— and c-TiN-enriched domains. The combination of elastic properties and a lattice mismatch between coherent c-AlN— and c-TiN-enriched domains leads to significant age hardening during which the hardness of (Ti,Al)N thin layers have shown to increase with between 15% and 20%. At further aging, c-AlN transforms into the thermodynamically stable hexagonal, wurtzite B4 structure, h-AlN resulting in a dual phase structure comprising c-TiN and h-AlN with reduced mechanical properties.

Today industry continuously seeks solutions for economic and high productivity/feed-through manufacturing. To meet these demands there is a need for new materials with advanced properties to improve tool life during operation. Within the metal cutting tool industry, a major part of this effort is focused to improve the wear behavior of the cutting tools by designing the properties of the coating material used in the application. Typically, a high productivity/feed-through cutting process results in a dramatic increase of the tool temperature and hence a coating material with a high temperature wear resistance is essential.

OBJECT OF THE INVENTION

It is an object of the present invention to provide a coated cutting tool with a coating showing improved high temperature properties, improved performance in metal cutting applications generating high temperatures and improved mechanical properties.

It is also an object of the present invention to provide a method for coating a cutting tool with said coating.

SUMMARY OF THE INVENTION

According to a first aspect of the present invention there is provided a coated cutting tool comprising a body and a hard and wear resistant coating on the body, the coating comprising at least one metal based nitride layer, wherein said layer is a $(Ti_{1-x}Al_x)N_y$ layer with $0<x<0.7$ and $0.4<y<1$ with a layer thickness between 0.5 μm and 15 μm.

According to one embodiment of the invention said layer is a nitrogen deficient $(Ti_{1-x}Al_x)N_y$ layer.

According to one embodiment of the present invention said layer is a nitrogen deficient cubic sodium chloride structure structured $c\text{-}(Ti_{1-x}Al_x)N_y$ layer.

According to one embodiment of the present invention said layer comprises a phase mixture of nitrogen deficient $c\text{-}(Ti_{1-x}Al_x)N_y$ and hexagonal h-AlN phases.

According to one embodiment of the invention $0.15<x<0.7$

According to one embodiment of the invention $0.3<x<0.7$

According to one embodiment of the invention $0.3<x<0.6$

According to one embodiment of the invention $0.4<x<0.6$

According to one embodiment of the invention $0.45<x<0.55$

According to one embodiment of the invention $0.5<y<1$

According to one embodiment of the invention $0.6<y<0.9$, preferably $0.65<y<0.75$.

According to one embodiment of the invention $0.7<y<0.9$

According to one embodiment of the invention $0.75<y<0.9$

According to one embodiment of the invention $0.75<y<0.85$

One advantage with the coated cutting tool according the present invention is that a coated cutting tool having improved performance in metal cutting applications generating high temperatures is achieved. Another advantage with the coated cutting tool according to the present invention is that the hard and wear resistant coating has improved high temperature properties in terms of suppressing the onset of the formation of unfavourable phases detrimental for its mechanical properties and hence also its cutting performance.

DETAILED DESCRIPTION OF PREFERRED EMBODIMENTS

Figure 1:
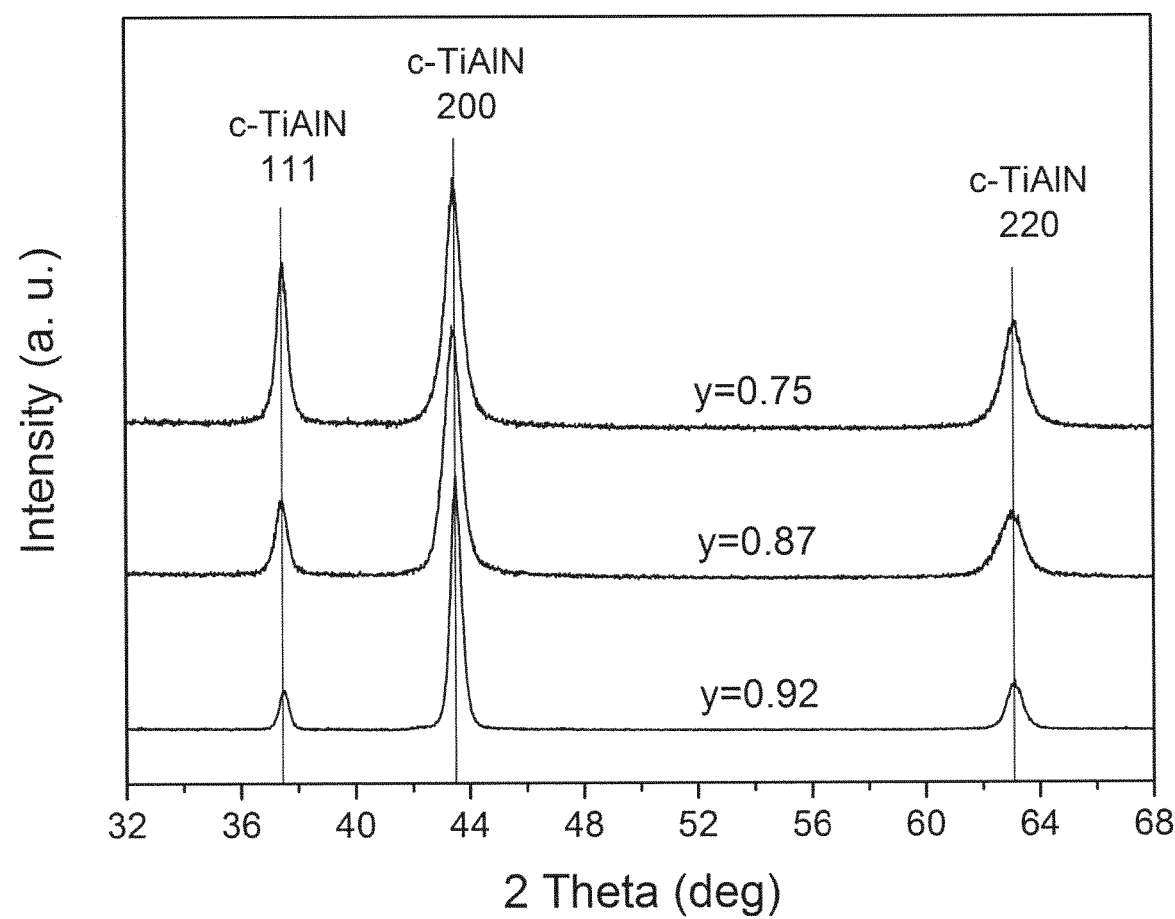
FIG. 1 shows X-Ray powder diffractograms from the nitrogen deficient as-deposited $(Ti_{0.5}Al_{0.5})N_y$, y=0.92, 0.87 and 0.75.

According to one embodiment of the invention, there is provided a coated cutting tool comprising a body and a hard and wear resistant coating on the body, the coating comprising at least one metal based nitride layer, wherein said layer is a $(Ti_{1-x}Al_x)N_y$ layer with 0<x<0.7 and 0.4<y<1.

According to one embodiment of the invention said layer is a nitrogen deficient $(Ti_{1-x}Al_x)N_y$ layer.

According to one embodiment of the present invention said layer is a nitrogen deficient cubic sodium chloride structure structured c-$(Ti_{1-x}Al_x)N_y$ layer.

According to one embodiment of the present invention said layer comprises a phase mixture of nitrogen deficient c-$(Ti_{1-x}Al_x)N_y$ and hexagonal h-AlN phases.

Said $(Ti_{1-x}Al_x)N_y$ layer has a thickness between 0.5 μm and 15 μm, preferably between 0.5 μm and 10 μm, most preferably between 0.5 μm and 5 μm. Additionally, the layer contains a sum of oxygen (O) and carbon (C) concentration between 0 and 2 at %, preferably between 0 and 1 at %.

The deposition method for said $(Ti_{1-x}Al_x)N_y$ layer is based on PVD techniques, preferably cathodic arc evaporation, using one or more pure, composite and/or alloyed (Ti,Al) cathodes. The layer is grown with an evaporation current between 50 A and 200 A depending on the cathode size, and said layer is $(Ti_{1-x}Al_x)N_y$ layer, where 0<x<0.7 and 0.4<y<1, preferably 0.5<y<0.9, most preferably 0.6<y<0.9. A higher evaporation current is needed for larger cathodes in order to achieve comparable deposition conditions. The layers are grown using one or more composite and/or alloyed cathodes. The desired layer composition is obtained by selecting appropriate composition of the (Ti,Al) cathode and gas atmosphere in a reactive mixed atmosphere containing $N_2$ and, e.g., Ar at a flow $N_2$ flow ratio between 0% and 100% and a total gas pressure between 1.0 Pa and 7.0 Pa, preferably between 1.5 Pa and 2.5 Pa. The negative substrate bias is between 0 V and 300 V, preferably between 20 V and 150 V, most preferably between 20 V and 60 V. The deposition temperature is between 200° C. and 800° C., preferably between 300° C. and 600° C.

For analysis, the $(Ti_{1-x}Al_x)N_y$ powder for each composition were obtained by separating the coating deposited on Fe-foils in two steps. First, the Fe-foil was thinned by mechanical grinding and then the rest of the Fe-foil was dissolved in 37% diluted hydrocloridric acid. The recovered coating flakes were cleaned with distilled water and acetone, dried at room temperature, and finally ground to a fine powder.

Atom probe tomography (APT) was performed using a local electrode atom probe (Cameca LEAP 3000X-HR) in laser mode, with a sample ground temperature of 60 K and a controlled evaporation rate of 0.5%. The GaAs-laser, with a 532 nm wavelength was set to strike the tip at a frequency of 200 kHz and an energy of 0.5 nJ. Data reconstruction was carried out with the software package IVAS (version 3.6.8, Cameca) using an evaporation field of 40 V/nm, an image compression factor of 1.65, and a field factor between 3.3 and 3.8 depending on the tip shank angle. Information from SEM images of the tips before and after APT, Kingham curves, and the artificial layering from the rotation drum during coating deposition was used to fit the reconstructions parameters. The morphology of microstructural features in three dimensions as well as chemical composition of said $(Ti_{1-x}Al_x)N_y$ layer, x and y including O and C was extracted from the as-deposited and powder annealed at 900° C. and 1200° C. samples. In addition, the composition of a few as-deposited films on substrate were analyzed by elastic recoil detection analysis (ERDA) using a 40 MeV I+ beam. The data was evaluated using the CONTES code (M. S. Janson. CONTES Conversion of Time-Energy Spectra—a program for ERDAdata/analysis. Internal report, Uppsala University, 2004).

Said layer has a columnar microstructure with an average column width of <1 μm, preferably <0.9 μm, more preferably <0.8 μm as determined by cross sectional transmission electron microscopy of a middle region of the layer, i.e. a region within 30% to 70% of the layer thickness in the growth direction, and said average columnar width is the average of at least 10 adjacent columns.

The microstructure, including the columnar width above, was evaluated with a transmission electron microscope (TEM) (Fei Tecnai G2 TF 20 UT) operated at an acceleration voltage of 200 kV. TEM samples were prepared by placing drops of powder particles dispersed in acetone on cooper grids containing a thin carbon foil and letting the acetone evaporate at room temperature.

Said layer has a compressive stress level of −6.0 GPa<σ<−0.5 GPa, preferably of −3.0 GPa<σ<−1.0 GPa. The residual stresses, σ, of the $(Ti_{0.5}Al_{0.5})N_y$ layers were evaluated by XRD measurements using the $\sin^2 \psi$ method with a Poisson's ratio of v=0.23 and a Young's modulus of E=379 GPa (see e.g. I. C. Noyan, J. B. Cohen, Residual Stress Measurement by Diffraction and Interpretation, Springer-Verlag, N.Y., 1987). The measurements were performed using CuKα-radiation on the (311)-reflection.

Figure 2A:
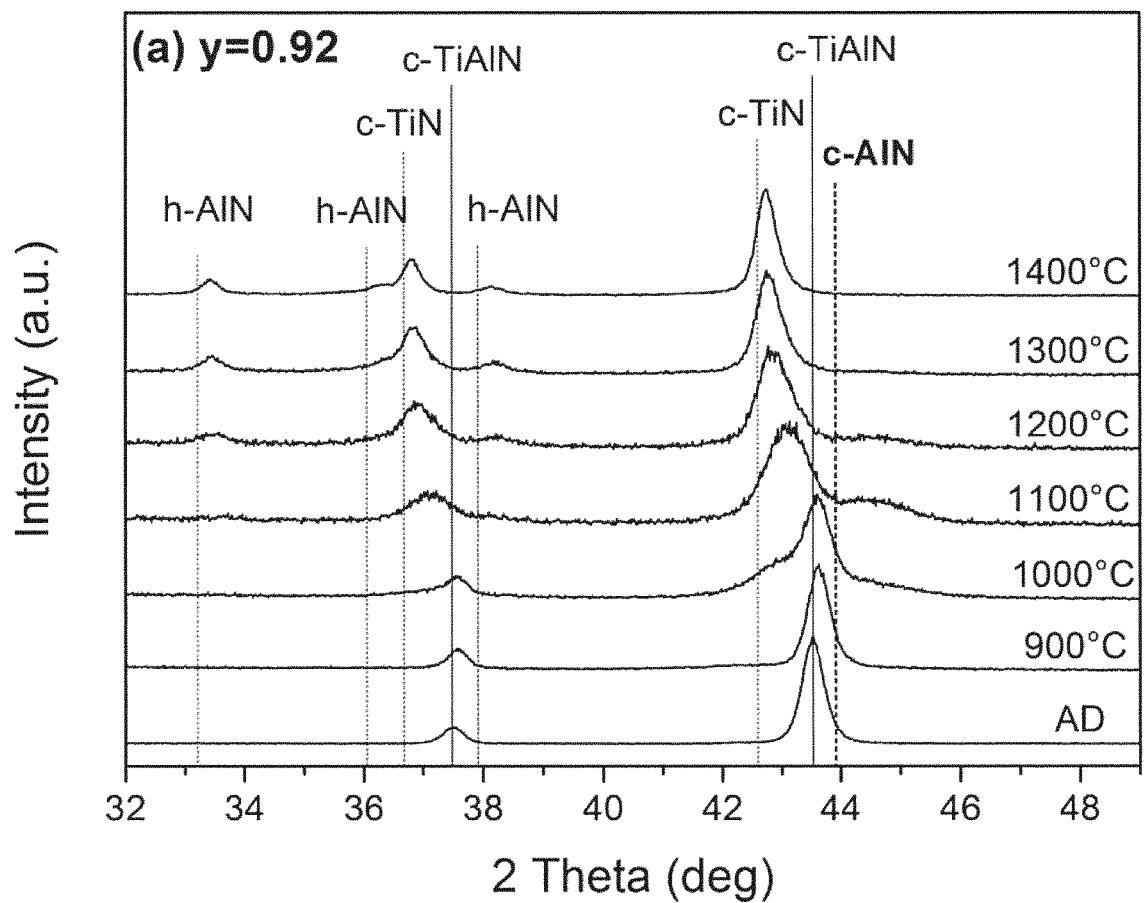
FIG. 2(a-c) shows X-ray diffractograms over the $(Ti_{0.5}Al_{0.5})N_y$, 111 and 200 diffraction peaks after annealing at different temperatures for a) y=0.92, b) y=0.87 and c) y=0.75.
Figure 2B:
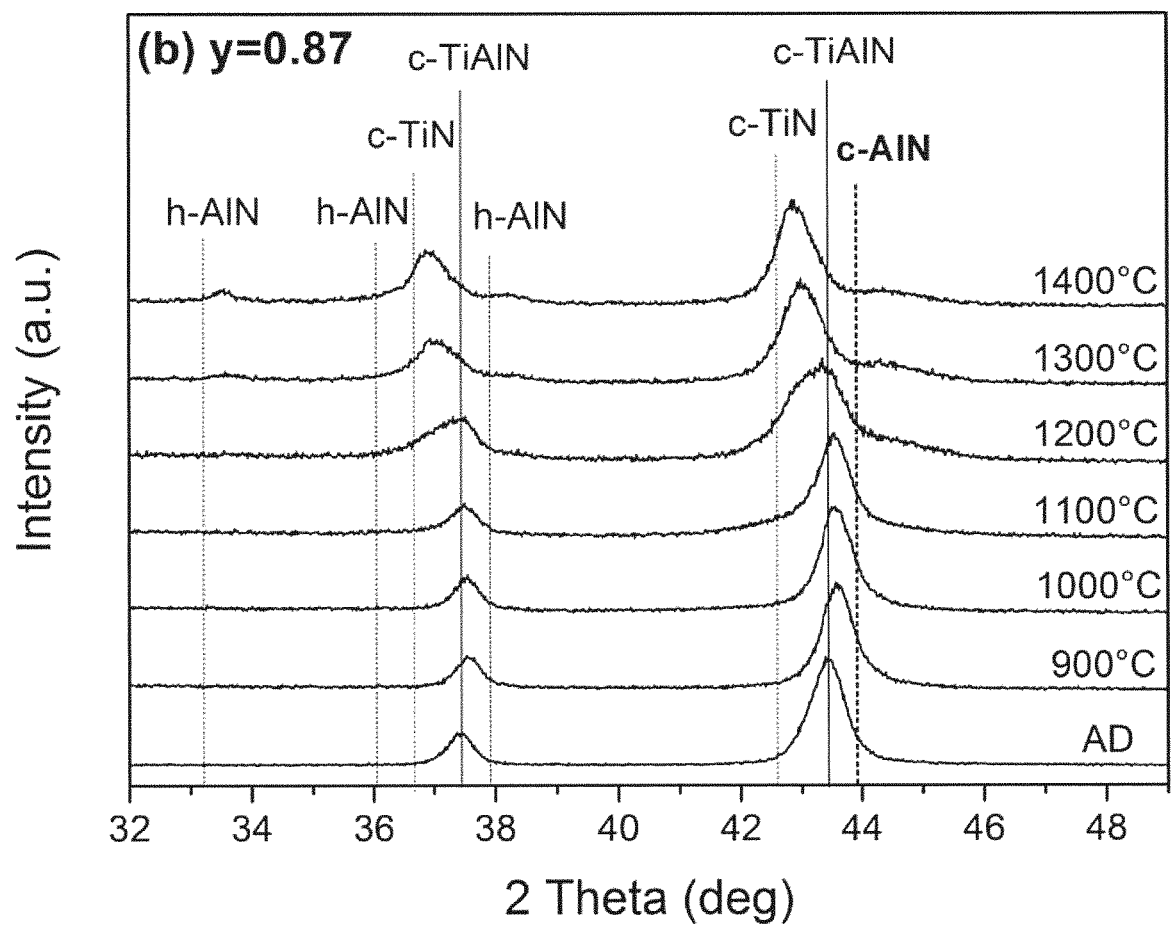
Figure 2C:
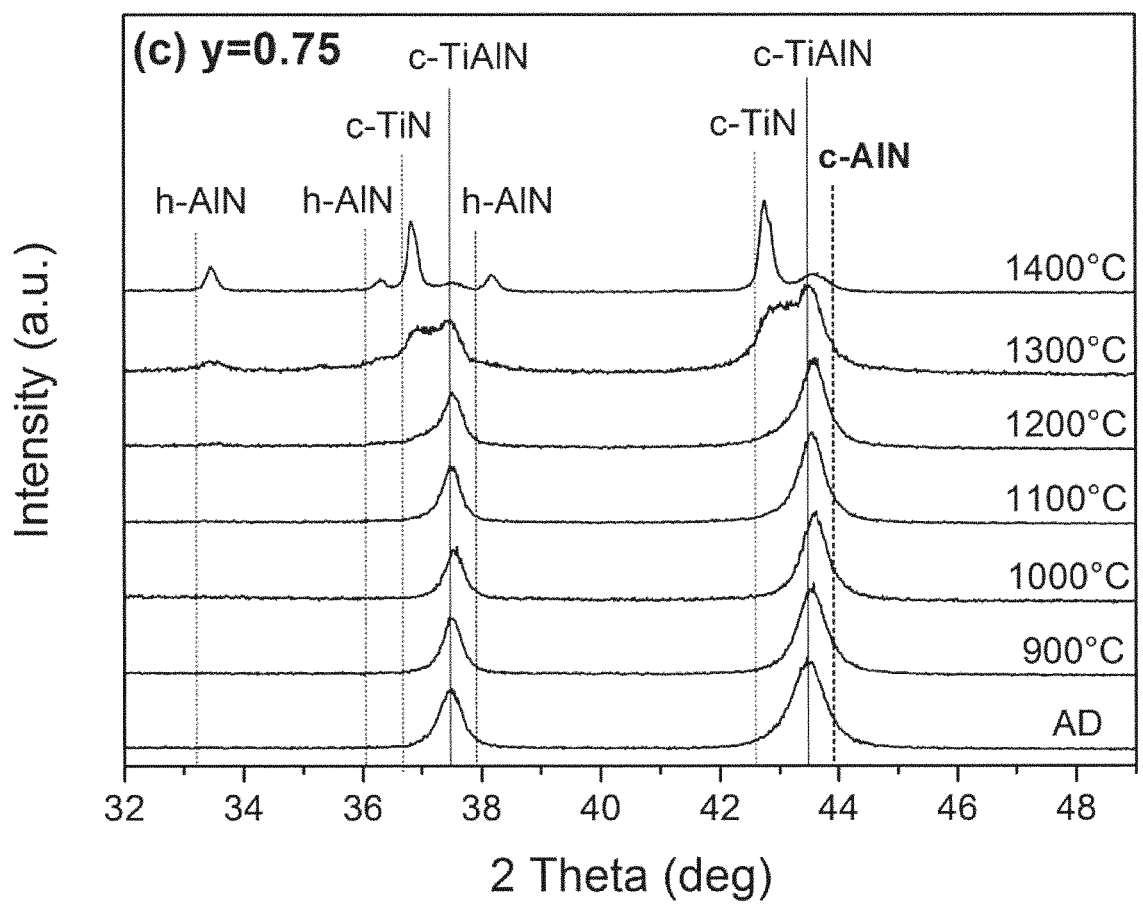

FIG. 2a-c shows X-ray diffractograms between 32°≤2Theta≤49° of $(Ti_{0.5}Al_{0.5})N_y$ after annealing at different temperatures for a) y=0.92, b) y=0.87 and c) y=0.75. The respective $(Ti_{0.5}Al_{0.5})N_y$ layers have a transformation temperature for the onset to the hexagonal h-AlN phase of >1100° C., preferably between 1100° C. and 1400° C., more preferably between 1200° C. and 1400° C., most preferably between 1300° C. and 1400° C. The h-AlN is detected as a measured relative diffracted intensity $I_{h-AlN}$>0%, preferably 0%<$I_{h-AlN}$<50%, more preferably 0%<$I_{h-AlN}$<25%, most preferably 0%<$I_{h-AlN}$<15%, for at least one of the hexagonal h-AlN peaks positioned at 2Theta of about 33.2°, 36° and/or 38°, respectively, to the intensity of the diffraction peak with the highest peak intensity in the X-ray diffractograms between 32°≤2Theta≤49°.

In addition to the compositional analysis, the XRD data, from for example FIG. 1, may also be used to estimate the nitrogen content y in $(Ti_{1-x}Al_x)N_y$ coatings by studying the relative intensities of the 111 and 200 diffraction peaks related to a change in the structure factor of the material. The structure factor linearly shifts towards a more metallic face centred cubic factor with increasing nitrogen deficiency and is observed as an increase of the relative intensity of the 111 diffraction peak. This effect is valid both for coating powders as well as for coatings on substrates. For coatings on substrates, however, various effects such as, e.g., texture may complicate the analysis. To overcome this, the nitrogen content is estimated by comparing by the 111 and 200 diffracted intensities of samples grown with a fixed metal composition and bias in different nitrogen environments. The latter has to be made once for each metal composition and bias to serve as a reference for the nitrogen content in a coating on a substrate.

According to one embodiment, said $(Ti_{1-x}Al_x)N_y$ layer has a ratio of the 111 ($I_{111}$) and 200 ($I_{200}$) diffracted intensities between $0.05<(I_{111})/(I_{200})<2.0$, preferably $0.1<(I_{111})/(I_{200})<1.0$, more preferably $0.1<(I_{111})/(I_{200})<0.8$.

According to one embodiment, said phase mixture comprising c-$(Ti_{1-x}Al_x)N_y$ and h-AlN shows an initial relative diffracted intensity, $I_{h-AlN}>0\%$, preferably $0\%<I_{h-AlN}<50\%$, more preferably $0\%<I_{h-AlN}<25\%$, most preferably $0\%<I_{h-AlN}<15\%$, for at least one of the hexagonal h-AlN peaks at 2Theta values of about 33.2°, 36° and/or 38°, respectively. After heat treatment (annealing), said relative initial diffracted intensities, $I_{h-AlN}$, starts to increases (grow in peak intensity) as a consequence of the formation of h-AlN at a given temperature. For said phase mixture, growth of the initial relative diffracted intensities, $I_{h-AlN}$, was delayed to temperatures >1100° C., preferably between 1100° C. and 1400° C., more preferably between 1200° C. and 1400° C., most preferably between 1300° C. and 1400° C.

X-ray diffractometry (XRD) was performed with a Panalytical X' Pert PRO MRD X-ray diffractometer using Cu Kα radiation and a Bragg-Brentano configuration. The sample was placed in a fused silica holder with a prepared cavity for powders. No spinning of the holder was used.

Figure 3:
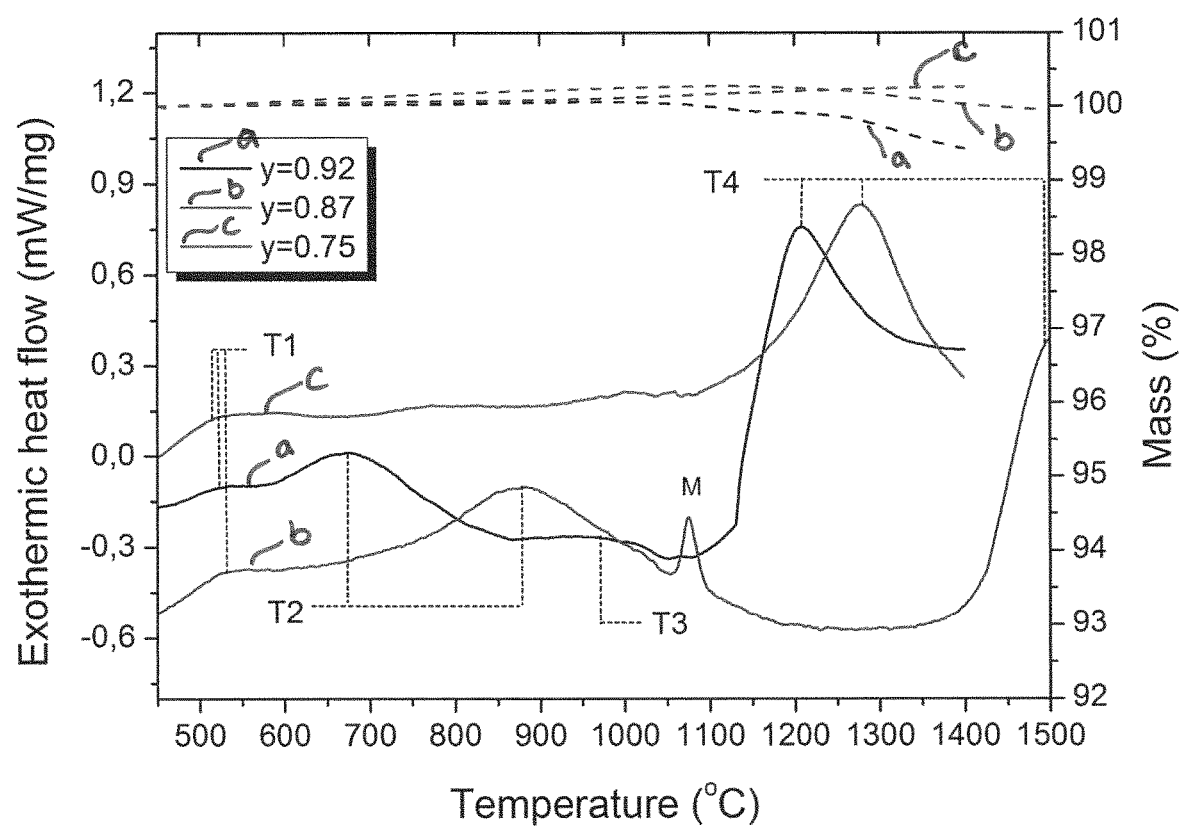
FIG. 3 shows differential scanning calorimetry response of $(Ti_{0.5}Al_{0.5})N_y$ for y=0.92, 0.87 and 0.75 including the mass change during the heating for each sample (dashed lines).
Figure 4:
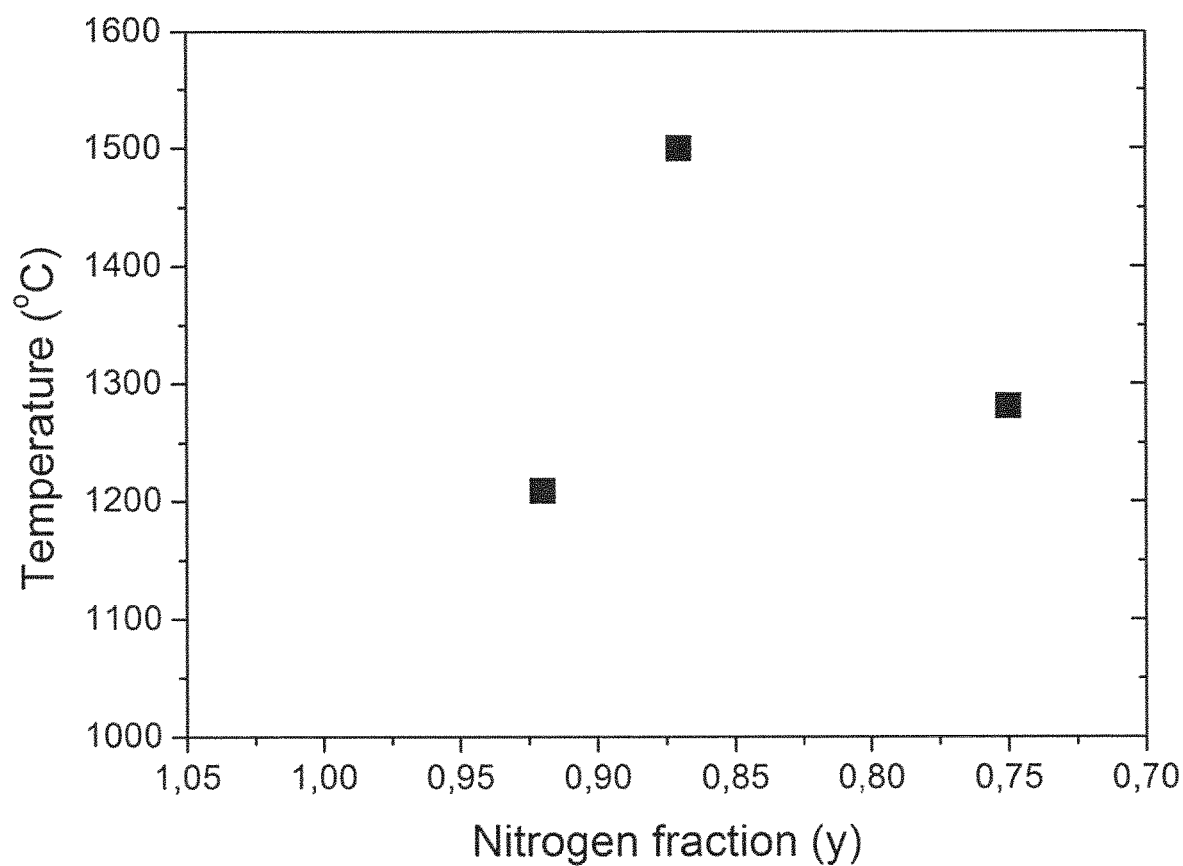
FIG. 4 shows transformation temperature for the onset of the hexagonal h-AlN phase as deduced from the differential scanning calorimetry measurements in FIG. 3.

FIG. 4 shows the transformation temperature for the onset to hexagonal h-$Al_xN_y$, the thermal response, deduced from differential scanning calorimetry measurements (FIG. 3) of $(Ti_{0.5}Al_{0.5})N_y$ for y=0.92, 0.87 and 0.75. The mass change during heating is shown for each sample (dashed lines in FIG. 3). The transformation temperature is >1200° C., preferably between 1200° C. and 1600° C., more preferably between 1300° C. and 1600° C., most preferably between 1400° C. and 1600° C.

The thermal response of the different $(Ti_{1-x}Al_x)N_y$—alloys was measured in a differential scanning calorimeter (DSC) (Netsch STA 449C), operating in a 50 ml/min argon flow. Each measurement was performed on 50 mg of powder of each $(Ti_{1-x}Al_x)N_y$ layer placed in an alumina crucible. All measurement started with an out-gassing period for one hour at 250° C. directly followed by two heating cycles up to 1400° C. with a rate of 20 K per min. The second heating cycle was used for base-line correction. In order to track the phase transformation, $(Ti_{1-x}Al_x)N_y$ powders were annealed using the same DSC-equipment to different temperatures (800 to 1400° C. in steps of 100° C.) always starting with fresh as-deposited powder for each one. In order to facilitate direct comparison with the DSC-measurements these heat treatments also started with an out-gassing period while just one heating cycle were performed to the maximum temperature. In this case a powder quantity of 15 mg was used.

Figure 5:
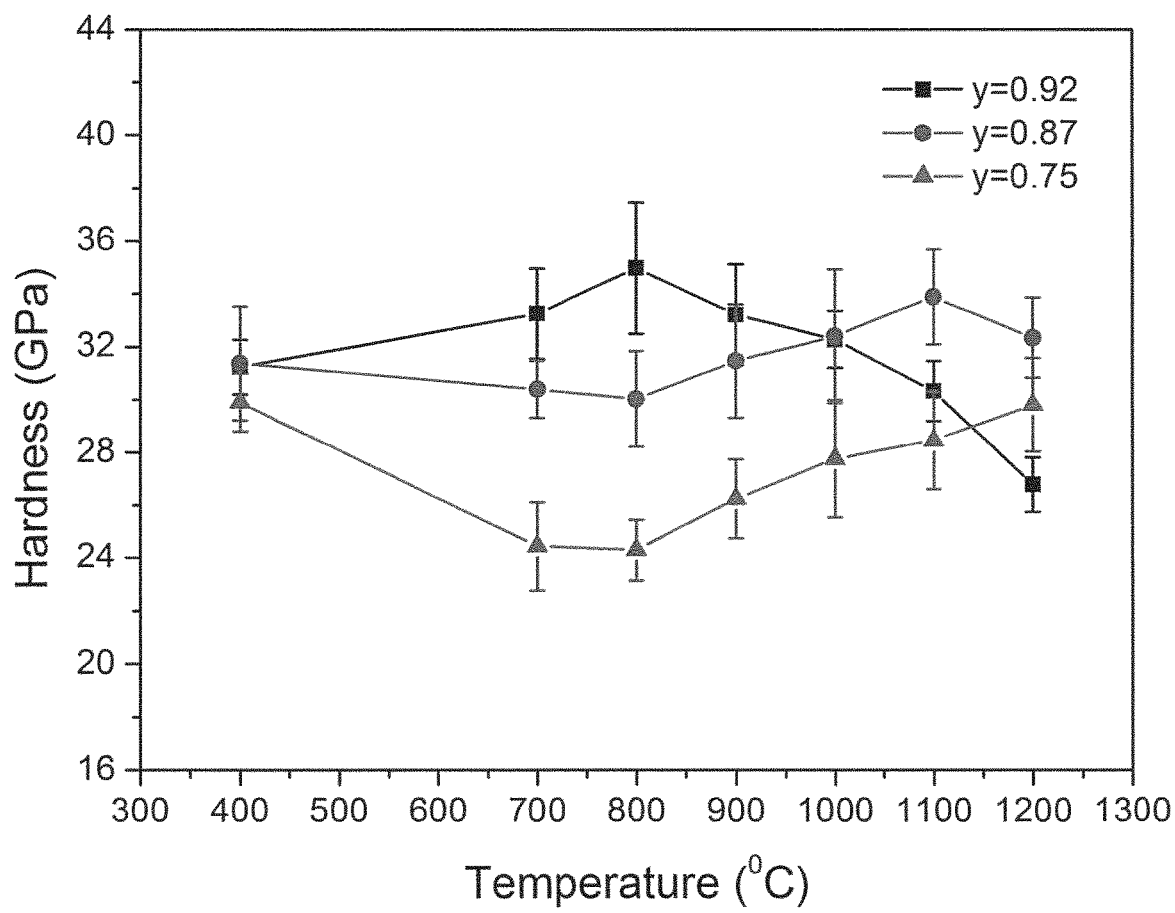
FIG. 5 shows hardness values of as-deposited and heat treated coatings of $(Ti_{0.5}Al_{0.5})N_y$ where y=0.92, 0.87 and 0.75.
Figure 6:
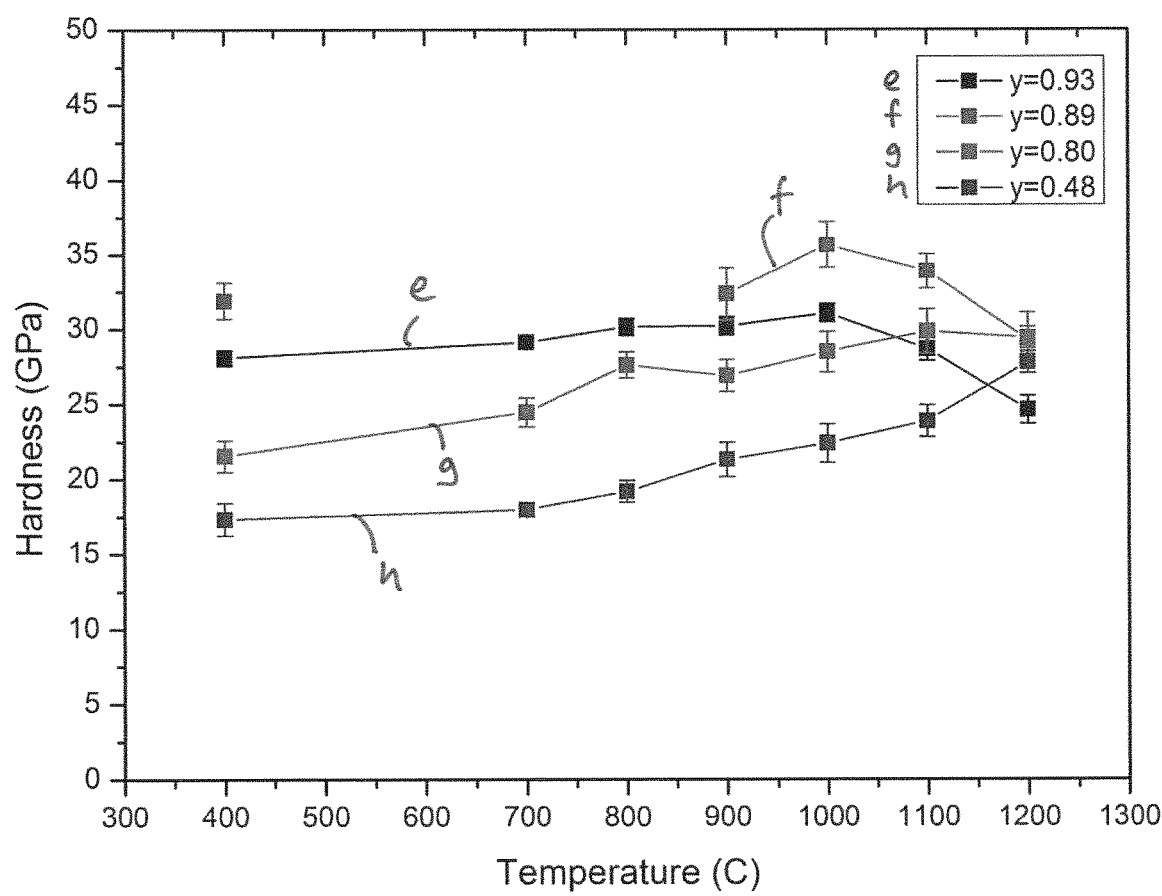
FIG. 6 shows hardness values of as-deposited and heat treated coatings of $(Ti_{0.4}Al_{0.65})N_y$ where y=0.93, 0.89, 0.80 and 0.48.

Said layer has a nanohardness between 20 GPa and 40 GPa, preferably between 24 GPa and 36 GPa, as evaluated by nanoindentation measurements (FIGS. 5 and 6). Nanohardness data were estimated by the nanoindentation technique of the layers after mechanical polishing of the surface using a UMIS 2000 nanoindentation system. 40-50 indents were made with a Berkovich diamond tip at a maximum tip load of 50 mN and averaged in the evaluation. The indentation depth was less than 10% of the coating thickness.

It is evident that said $(Ti_{1-x}Al_x)N_y$ layer can be part of a complex coating design and used as an inner, middle and/or an outer layer of said complex coating.

According to one embodiment of the present invention, where the cutting tool comprises a body, also called substrate, provided with a coating comprising an innermost single layer and/or multilayer comprising, e.g., TiN, TiC, Ti(C,N) or (Ti,Al)N, preferably a single layer of (Ti,Al)N, followed by said $(Ti_{1-x}Al_x)N_y$ layer and an outermost single layer and/or multilayer comprising, e.g., TiN, TiC, Ti(C,N) or (Ti,Al)N, preferably a single layer of TiN, with a total coating thickness between 1 µm and 20 µm, preferably between 1 µm and 15 µm, and most preferably between 1 µm and 7 µm.

According to one embodiment of the invention, said body is a cutting insert for machining by chip removal comprising a body of a hard alloy of cemented carbide, cermet, ceramics, cubic boron nitride based material or high speed steel. It is, however, obvious that said body can be other metal cutting tools, e.g., drills and end mills.

The invention also relates to the use of coated cutting tool insert according to the above for machining at cutting speeds of 50-400 m/min, preferably 75-300 m/min, with an average feed, per tooth in the case of milling, of 0.08-0.5 mm, preferably 0.1-0.4 mm, depending on cutting speed and insert geometry.

EXAMPLE 1

Cemented carbide inserts (ISO geometries CNMA120412 and TPUN120408) with composition 94 wt % WC-6 wt % Co were used as a body for the layer depositions by cathodic are evaporation.

Before deposition, the inserts were cleaned in ultrasonic baths of an alkali solution and alcohol. The system was evacuated to a pressure of less than $2.0\times10^{-3}$ Pa, after which the inserts were sputter cleaned with Ar ions. $(Ti_{1-x}Al_x)N_y$ layers, $0.4<x\leq1$, $0.4<y<0.9$. Coatings 1-18 in Table 1, were grown using $Ti_{1-z}Al_z$ cathodes where $0.55\leq z\leq1$. The layers were deposited at 450° C. in a mixed $Ar/N_2$ atmosphere at $N_2$ flow ratios ($N_2/(N_2+Ar)$) between 25% and 100%, a process pressure of 2 Pa, a bias of −30 V and an evaporation current of 150 A to a total thickness of about 3 µm. Table 1 shows the $N_2$ flow ratios, cathode composition, the chemical composition of the as-deposited coatings by atom probe and ERDA, XRD peak area ratio of the main lattice planes and the column width as determined by TEM of the as deposited samples for coatings 1-18.

TABLE 1

| | | | | Atom Probe | | | ERDA | | | |
|---|---|---|---|---|---|---|---|---|---|---|
| Coating | Name | % N2 | Cathode composition | Nitrogen content at. % | Nitrogen fraction y = N/ (Al + Ti) | Aluminum (metallic) fraction x = Al/ (Al + Ti) | Nitrogen content at. % | Nitrogen fraction y = N/ (Al + Ti) | Aluminum (metallic) fraction x = Al/ (Al + Ti) | XRD Peak area ratio 111/200 | TEM Column width Nm |
| 1 | $TiN_{0.96}$ | 100 | Ti | 48.8 | 0.96 | | 1 | | | | |
| 2 | $TiN_{0.86}$ | 40 | Ti | 46.2 | 0.86 | | 1 | | | | |
| 3 | $TiN_{0.82}$ | 37 | Ti | 45 | 0.82 | | 1 | | | | |
| 4 | $TiN_{0.73}$ | 33 | Ti | 42.4 | 0.73 | | 1 | | | | |

TABLE 1-continued

| | | | | Atom Probe | | | ERDA | | | | |
|---|---|---|---|---|---|---|---|---|---|---|---|
| Coating | Name | % N2 | Cathode composition | Nitrogen content at. % | Nitrogen fraction y = N/(Al + Ti) | Aluminum (metallic) fraction x = Al/(Al + Ti) | Nitrogen content at. % | Nitrogen fraction y = N/(Al + Ti) | Aluminum (metallic) fraction x = Al/(Al + Ti) | XRD Peak area ratio 111/200 | TEM Column width Nm |
| 5 | TiN$_{0.49}$ | 29 | Ti | 33.2 | 0.49 | 1 | | | | | |
| 6 | TiN$_{0.41}$ | 25 | Ti | 29.1 | 0.41 | 1 | | | | | |
| 7 | (Ti$_{0.5}$Al$_{0.5}$)N$_{0.92}$ | 100 | Ti$_{0.45}$Al$_{0.55}$ | 47.8 ± 0.3 | 0.92 ± 0.01 | 0.48 ± 0.01 | 46.3 | 0.87 | 0.45 | 0.14 | ~900 |
| 8 | (Ti$_{0.5}$Al$_{0.5}$)N$_{0.87}$ | 40 | Ti$_{0.45}$Al$_{0.55}$ | 46.4 ± 0.2 | 0.87 ± 0.01 | 0.48 ± 0.01 | | | | 0.22 | ~600 |
| 9 | | 37 | Ti$_{0.45}$Al$_{0.55}$ | | | | | | | | |
| 10 | (Ti$_{0.5}$Al$_{0.5}$)N$_{0.75}$ | 33 | Ti$_{0.45}$Al$_{0.55}$ | 42.8 ± 0.6 | 0.75 ± 0.02 | 0.47 ± 0.01 | | | | 0.44 | ~700 |
| 11 | | 29 | Ti$_{0.45}$Al$_{0.55}$ | | | | | | | | |
| 12 | (Ti$_{0.5}$Al$_{0.5}$)N$_{0.45}$ | 25 | Ti$_{0.45}$Al$_{0.55}$ | 29.1 ± 0.0 | 0.45 | 0.49 | 32.4 | 0.52 | 0.51 | | |
| 13 | (Ti$_{0.4}$Al$_{0.6}$)N$_{0.93}$ | 100 | Ti$_{0.33}$Al$_{0.67}$ | 48.1 ± 0.3 | 0.93 | 0.60 | 47.5 | 0.91 | 0.63 | | |
| 14 | (Ti$_{0.4}$Al$_{0.6}$)N$_{0.89}$ | 40 | Ti$_{0.33}$Al$_{0.67}$ | 49.5 ± 0.3 | 0.89 | 0.61 | | | | | |
| 15 | | 37 | Ti$_{0.33}$Al$_{0.67}$ | | | | | | | | |
| 16 | (Ti$_{0.4}$Al$_{0.6}$)N$_{0.80}$ | 33 | Ti$_{0.33}$Al$_{0.67}$ | 44.1 ± 0.5 | 0.80 | 0.61 | | | | | |
| 17 | | 29 | Ti$_{0.33}$Al$_{0.67}$ | | | | | | | | |
| 18 | (Ti$_{0.4}$Al$_{0.6}$)N$_{0.48}$ | 25 | Ti$_{0.33}$Al$_{0.67}$ | 32.2 ± 2.9 | 0.48 | 0.63 | | | | | |

EXAMPLE 2

For a cutting test using the coatings from Table 1 (example 1) in a turning operation with the following data:
Geometry: TPUN120408
Application: Facing
Work piece material: 100Cr6
Cutting speed: 320 m/min
Feed: 0.25 mm/rev.
Depth of cut: 2 mm
Performance criterion: Crater wear resistance Table 2 show the relative cutting results of the invention with improved crater wear performance with a stop criteria of 1 mm$^2$ crater area relative to reference coatings 19 and 20 according to prior art.

TABLE 2

| Coating | Relative performance |
|---|---|
| Coatings according to embodiments of the invention | |
| coating 7 | 70 |
| coating 8 | 90 |
| coating 10 | 85 |
| Reference coatings according prior art | |
| coating 19 Ti$_{0.34}$Al$_{0.66}$N (ref) | 70-75 |
| coating 20 TiN (ref) | 50-60 |

The invention claimed is:

1. A coated cutting tool comprising:
a body; and
a hard and wear resistant coating on the body, the coating including at least one cathodic arc evaporated metal based nitride layer, wherein said layer is a (Ti$_{1-x}$Al$_x$)N$_y$ layer with $0.15<x<0.7$ and $0.5<y<0.9$ with a layer thickness between 0.5 µm and 15 µm.

2. The coated cutting tool according to claim 1, wherein said layer is a nitrogen deficient cubic sodium chloride structured c-(Ti$_{1-x}$Al$_x$)N$_y$ layer.

3. The coated cutting tool according to claim 1, wherein $0.3<x<0.6$.

4. The coated cutting tool according to claim 1, wherein $0.6<y<0.9$.

5. The coated cutting tool according to claim 1, wherein said layer has a thickness between 0.5 µm and 10 µm.

6. The coated cutting tool according to claim 1, wherein said layer has a transformation temperature for the onset to hexagonal h-AlN phase of >1100° C., deduced from X-ray diffractograms of (Ti$_{0.5}$Al$_{0.5}$)N$_y$ being annealed at different temperatures and by detecting the h-AlN as a measured relative diffracted intensity $I_{h-AlN}>0\%$ for at least one of the hexagonal h-AlN peaks positioned at 2Theta of about 33.2°, 36° and 38°, to the intensity of the diffraction peak with the highest peak intensity in the X-ray diffractograms between $32°\leq 2Theta \leq 49°$.

7. The coated cutting tool according to claim 1, wherein said at least one metal based nitride layer has a nanohardness between 20 GPa and 40 GPa, when measured with a UMIS 2000 nanoindentation system by making 40-50 indentations with a Berkovich diamond tip at a maximum tip load of 50 mN, the indentation depth being less than 10% of the coating thickness, and the average nanohardness being evaluated from the indentations made.

8. The coated cutting tool according to claim 1, wherein said coating includes an innermost single layer and/or multilayer including TiN, TiC, Ti(C,N) or (Ti,Al)N, and an outer single layer and/or multilayer including TiN, TiC, Ti(C,N) or (Ti,Al)N, to a total coating thickness between 1 µm and 20 µm.

9. The coated cutting tool according to claim 8, wherein the innermost multilayer is a single layer of (Ti,Al)N followed by a (Ti$_{1-x}$Al$_x$)N$_y$ layer.

10. The coated cutting tool according to claim 8, wherein the outer single layer is TiN.

11. The coated cutting tool according to claim 1, wherein said coated cutting tool is a cutting insert for machining by chip removal comprising a body of a hard alloy of cemented carbide, cermet, ceramics, cubic boron nitride based material or high speed steel.

12. The coated cutting tool according to claim 1, wherein said coated cutting tool is a drill or end-mill for machining by chip removal comprising a body of a hard alloy of cemented carbide, cermet, ceramics, cubic boron nitride based material or high speed steel.

13. The coated cutting tool according to claim 1, wherein said layer has a transformation temperature for the onset to hexagonal h-AlN phase, deduced from X-ray diffractograms, between 1100° C. and 1400° C.

14. A method of making a coated cutting tool, comprising:
growing a metal based nitride layer on a body by cathodic arc evaporation with an evaporation current between 50 A and 200 A using composite and/or alloyed cathodes, wherein said layer is $(Ti_{1-x}Al_x)N_y$ with $0.15<x<0.7$ and $0.5<y<0.9$ according to claim 1; and growing the nitride based layer in a reactive mixed atmosphere containing $N_2$ and optionally Ar, at a $N_2$ flow ratio between 15% and 100% and a total gas pressure between 1.5 Pa and 2.5 Pa, with a negative substrate bias between 0 V and 300 V, at a temperature between 200° C. and 800° C.

15. A use of a coated cutting tool according to claim 1 for machining by chip removal, specifically generating high temperatures, at cutting speeds of 50-400 m/min, with an average feed, per tooth in the case of milling, of 0.08-0.5 mm, depending on cutting speed and insert geometry.

* * * * *